United States Patent [19]

Kusakari

[11] Patent Number: 5,432,743
[45] Date of Patent: Jul. 11, 1995

[54] SEMICONDUCTOR DYNAMIC RAM FOR IMAGE PROCESSING

[75] Inventor: Takashi Kusakari, Tokyo, Japan

[73] Assignee: NEC Corporation, Tokyo, Japan

[21] Appl. No.: 84,016

[22] Filed: Jun. 30, 1993

[30] Foreign Application Priority Data

Jun. 30, 1992 [JP] Japan .................. 4-196387
Jun. 30, 1992 [JP] Japan .................. 4-196388

[51] Int. Cl.[6] ............................................. G11C 7/00
[52] U.S. Cl. .................. 365/196; 365/189.02; 365/233
[58] Field of Search ............... 365/189.02, 219, 220, 365/230.05, 230.09, 230.02, 230.01, 233, 196, 189.07, 195

[56] References Cited

U.S. PATENT DOCUMENTS 4,633,441 12/1986 Ishimoto .................. 365/189
4,951,251 8/1990 Yamaguchi et al. ........... 365/189.02
5,206,832 4/1993 Yamaguchi et al. ........... 365/230.02
5,249,159 9/1993 Sato ........................... 365/189.04

Primary Examiner—Joseph A. Popek
Assistant Examiner—Vu Le
Attorney, Agent, or Firm—Sughrue, Mion, Zinn, Macpeak & Seas

[57] ABSTRACT

A semiconductor dynamic RAM for image processing, according to the present invention, comprises a VRAM having logical operation function of performing a predetermined logical operation of an input data signal and an output from a selected one of memory cells and rewriting the selected memory cell with a result of the operation. It includes a write read control circuit including a level determination circuit for determining a level of the input signal under control of the logical operation enable signal. Based on the result of determination of the logical level of the input signal, either write of the input signal to the selected memory cell or refresh of information stored in the selected cell is performed to effectively perform the logical operation.

4 Claims, 4 Drawing Sheets

SEMICONDUCTOR DYNAMIC RAM FOR IMAGE PROCESSING

BACKGROUND OF THE INVENTION

The present invention relates to a dynamic random access memory (DRAM) for image processing and, particularly, to a DRAM of this kind having high speed image processing performance.

A DRAM of this kind which is disposed between a CPU and a data display device of a compact computer such as EWS or personal computer for performing read/write of data to be displayed under control of the CPU has been widely used under the name of video RAM (VRAM) or graphic memory. The operating speed and flexibility in processing an image required for such memory is being increased more and more. In response to such requirements, a write per bit function for random write, a block write function for write in an assigned cell block having a plurality of bits (32 or 64) by 1 cycle clock pulse and/or a flush write function for write cells corresponding to an assigned number of rows (8 or 16 rows) by 1 cycle is attached to a VRAM as disclosed in U.S. Pat. No. 4,633,441.

However, when a control circuit for a laser printer is constructed with such VRAM, formation of graphic image and/or its modification must be performed by reading pixel data stored in an address of the VRAM, logically operating on it with new pixel data and/or display condition, forming pixel data after the modification and rewriting it in the same address. That is, it requires VRAM access operation and CPU operation over a plurality of clock pulse cycles for formation and/or modification of graphic image. Among logical operations, OR operation is most frequently used in the control circuit of the laser printer and a result of the OR operations is rewritten in the VRAM. In such a case, it requires at least 3 clock pulse cycles for an operation time for read/logical operation/rewrite, corresponding to at least 3 clock pulse cycles including access times to the CPU and the VRAM.

In order to reduce this time, U.S. Pat. No. 4,951,251 proposes a VRAM having an internal circuit formed within a semiconductor chip forming the VRAM, in which a level of a predetermined control signal supplied to the semiconductor chip prior to a chip selection signal is determined, a signal supplied to an address terminal in synchronism with the chip selection signal is taken in as a function signal and performs various operations including the logical operation function in response to the function signal. That is, the internal circuit includes a logical operation circuit which logically operates a read output from a RAM with a write signal from an external terminal in response to the function signal and generates a rewrite signal therefrom. In case where the logical operation performed in response to the function signal is an OR operation to form a logical sum (OR), the read output from a certain address of the RAM is OR operated with an input image data according to a read-modify-write operation and an OR output thereof is rewritten in the same address as new pixel data. This operation is completed within 1 clock pulse cycle. However, the read-modify-write operation requires a longer time compared with a simple write operation due to inclusion of read operation. For example, a usual write operation cycle time of such VRAM is 190 nS while the read-modify-write operation cycle time is 260 nS indicating an increase of about 37%.

Further, the internal circuit requires a function setting circuit for generating a function signal enabling the aforementioned logical operation as well as other logical operations, operation circuits for performing these logical operations and latch circuits for storing RAM read outputs, etc., causing the cost of VRAM to be increased.

SUMMARY OF THE INVENTION

Therefore, an object of the present invention is to provide a VRAM capable of operating at high speed, without increase of manufacturing cost.

According to the present invention, a VRAM comprises dynamic memory means including an array of a plurality of memory cells arranged in a row and column matrix, selection means for selecting the memory cells, read means for reading information stored in the memory cells and write means for writing input data to the memory cells, input means including a first input terminal for receiving an input data signal, a second input terminal for receiving logical operation enable signal for operating the input data with an information stored in a selected one of the memory cells according to a predetermined logical operation and a third input terminal for receiving a write enable signal instructing the write means to write to the selected memory cell, level determination means disposed between the memory means and the first, second and third input terminals for determining, in synchronism with a logical operation timing signal supplied in response to activation of the write enable signal and the logical operation enable signal, whether a level value of the input data signal is a first or a second level corresponding to a result of the predetermined logical operation, and logical operation data write control means including write control means for supplying said input data to the memory write means when the level value is the first level and instructing an inhibition of write to the memory write means when the logical value is the second level.

The VRAM according to the present invention can achieve the above mentioned logical operation without increase of cycle time and, therefore, is suitable for increasing operation speed of a laser printer. Further, since the logical operation is limited to those indispensable basically, the circuit construction therefor can be simplified and thus the manufacturing cost of the VRAM is reduced.

BRIEF DESCRIPTION OF THE DRAWINGS

The above-mentioned and other objects, features and advantages of the present invention will become more apparent by reference to the following detailed description of the present invention taken in conjunction with accompanying drawings, wherein.

DETAILED DESCRIPTION OF THE PREFERRED EMBODIMENTS

Figure 1:
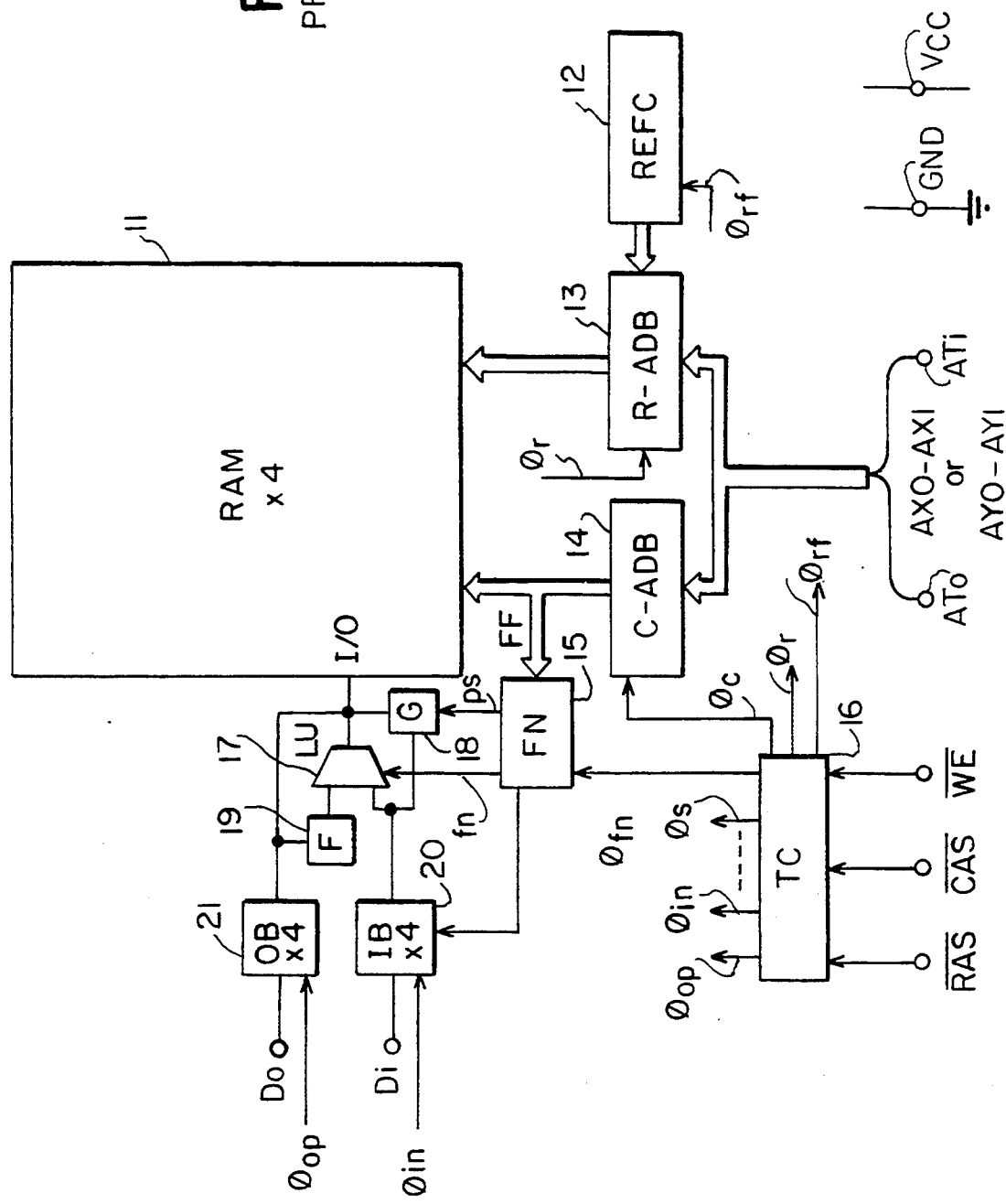
FIG. 1 is a block diagram of a conventional VRAM.

In FIG. 1 which shows, in a block circuit form, a conventional VRAM which, for simplicity of description, is a multi-bit output type memory capable of writing/reading 4-bit data as a unit, the VRAM includes a memory portion (RAM) 11 composed of four memory arrays each being a dynamic RAM constructed such that it can be simultaneously accessed to by 4-bit code word, that is, in X4 bit pattern, a sense amplifier (not shown) and row and column address decoders (not shown), a refresh control circuit (REFC) 12 including a refresh address counter (not shown) for forming a refresh address signal, a row address buffer (R-ADB) 13 which takes in an external address signal in synchronism with a timing signal formed from a row address strobe signal $\overline{RAS}$ and forms an internal complementary signal which is to be transmitted to the row address decoder, a column address buffer (C-ADB) 14 which takes in the external address signal in synchronism with a timing signal formed from a column address strobe signal $\overline{CAS}$ and forms an internal complementary signal which is to be transmitted to the column address decoder, a function setting circuit (FN) 15 which decodes a function setting signal FF to generate an operation mode signal fn for setting an operation mode, a mask signal msk for selectively invalidating an operation of a data input circuit 20 and a pass signal ps for controlling a gate circuit 18, a timing signal generator circuit (TC) 16 which responds to the signals $\overline{RAS}$ and $\overline{CAS}$ and a write enable signal $\overline{WE}$, discriminates an operation mode instructed by a combination of these signals and generates various timing signals such as timing signals $\phi r$ and $\phi fn$ to be used in other internal circuits, a logical operation circuit (LU) 17 which includes four sets of circuits corresponding to the respective four memory arrays of the memory portion 11 and responds to a signal held in a latch circuit 19 provided in one of the inputs and the write signals to generate logical operation outputs such as logical product (AND), negation of logical product (NAND), logical sum (OR), negation of logical sum (NOR), inversion (NOT) and exclusive logical sum (EX-OR), etc., of these signals according to the operation mode signal fn, a gate circuit (G) 18 for passing the input code word through the circuit 17 without operating it logically to the memory portion 11 when logical operation is unnecessary, a latch circuit (F) 19 for latching an output code word from the I/O of the memory portion 11, a data input circuit (IB) 20 and a data output circuit (OB) 21. Further, a group of four parallel data output terminals Do and a group of four parallel data input terminals Di are included although these terminal groups are shown by single lines, respectively, for simplicity of illustration. The timing signal generator circuit 16 is constructed such that the operation mode can be discriminated in the following manner. Namely, if the column address strobe signal $\overline{CAS}$ and the write enable signal $\overline{WE}$ are set on the low level (enable level) when the row address strobe signal $\overline{RAS}$ which is substantial chip selection signal is changed from the high level (inactive level) to the low level (active level), the timing signal generator circuit 16 regards the preset operation mode as being indicated by the combination of those signals. The preset operation mode is continued until the row address strobe signal $\overline{RAS}$ is set again to the high level. In this preset operation mode, the timing signal generator circuit 16 generates the timing signal $\phi fn$. If the signal $\overline{WE}$ is set to the high level (inactive level) when the signal RAS is changed from the high level to the low level, the timing signal generator circuit 16 regards the access operation mode as being indicated by the combination of these signals $\overline{RAS}$ and $\overline{WE}$.

Figure 2A:
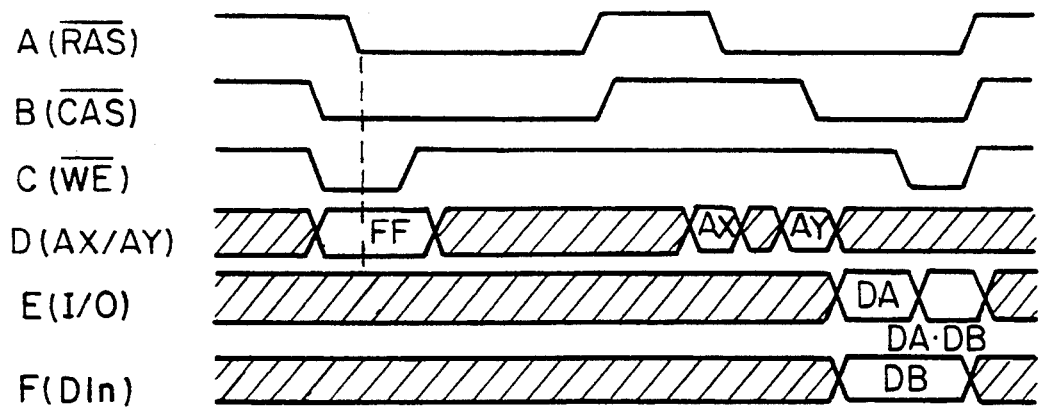
FIGS. 2(A) and 2(B) are timing charts showing an operation of the circuit shown in FIG. 1.
Figure 2B:
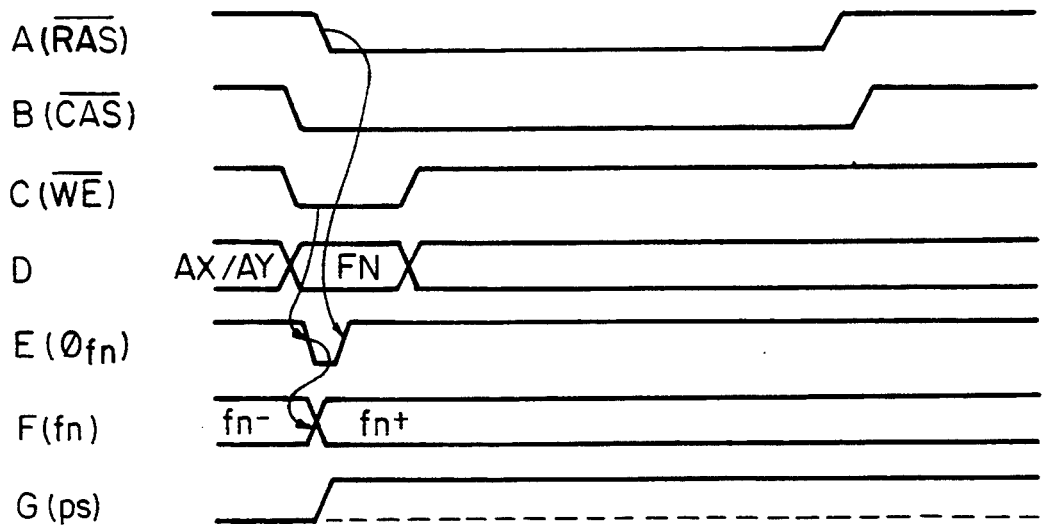

Referring to FIGS. 2(A) and 2(B), together with FIG. 1, the refresh operation is first performed in the following manner. Before the signal $\overline{RAS}$ is changed from the high level to the low level, the signals $\overline{CAS}$ and $\overline{WE}$ are set to the low level, upon which the internal circuit enters into the operation state in synchronism with the state change of the signal $\overline{RAS}$ from the high level to the low level, the timing signal generator circuit 16 generates the refresh signal $\phi rf$ and the latter signal is supplied to the refresh control circuit 22 to cause the latter to generate various timing signals such as refresh address signal, etc., to thereby actuate the refresh cycle. (CAS before RAS refresh). In this refresh operation, the input terminal of the row address buffer 13 is connected to the refresh control circuit 12 and is disconnected from the external address terminal.

When the timing signal generator circuit 16 detects that both the signal $\overline{CAS}$ and the signal $\overline{WE}$ are in the low level, it generates a timing signal $\phi c$ for activating the column address buffer 14 and a timing signal $\phi fn$ for activating the function setting circuit 15, in response to the change of the signal $\overline{RAS}$ to the low level. Since there is no data line selection timing signal $\phi y$ generated in the refresh operation, the column address decoder in the memory portion 1 is substantially put in active state. Therefore, the function setting signal FF, supplied from the address terminals AT0-ATi and passed through the column address buffer 14, is taken in the function setting circuit 15 which is set in an active state. The function setting circuit 15 decodes the function signal FF thus taken in to generate various mode signals corresponding to the next operation, while keeping the function signal FF therein. In this manner, the refresh operation and the take-in operation of the function signal FF are performed in parallel in a single memory cycle (refresh cycle). Then, the signals, $\overline{RAS}$, $\overline{CAS}$ and $\overline{WE}$ are set to the high level to reset the internal circuit. Also in this reset state, the function setting circuit 15 keeps the function signal FF therein continuously.

Then, in response to the change of the signal $\overline{RAS}$ from the high level to the low level, the timing signal generator circuit 16 generates a timing signal $\phi r$ to activate the row address buffer 13, which then takes the address signals from the address terminals AT0-ATi therein as the row address signal AX (AX0-AXi) and performs the word line selection for the memory portion 11.

Thereafter, in response to the change of the signal $\overline{CAS}$ from the high level to the low level, the timing signal generator circuit 16 generates a timing signal $\phi c$ to activate the column address buffer 14, which then takes the address signals from the address terminals AT0-ATi therein as the column address signal AY (AY0-AYi) and performs the bit line selection for the memory portion 11. Thus, memory information DA in the memory cell assigned by the address signals AX and AY is read in the latch circuit F.

On the other hand, in the write operation mode in which the signal $\overline{WE}$ is in the low level, the input code word DB from the input data terminal Di is taken in through the data input circuit 20. When the function setting circuit 18 sends the operation mode signal Fn indicating, for example, an OR operation to the logical operation circuit 17, the latter generates a signal (DA+DB) (referred to as "signal DW", hereinafter) indicative of an OR output between the signal DA of the latch circuit 19 and the input signal DB. The signal DW is transmitted to the I/O node of the memory portion and rewritten in the selected memory cell. The one cycle write operation according to the read-modify-write is performed in this manner and the information stored in the memory cell is replaced by data which is obtained as a result of the instructed logical operation of it and the write signal fed from the external terminal. Although each of the signals DA, DB and DW are considered as a single signal in the above description for simplicity of explanation, it is practically a complementary signal composed of a positive signal and an inversion thereof.

The write to the selected memory cell is performed according to values of the complementary data signal DW and inverted signal $\overline{DW}$ in the following manner. That is, when the signal DW is logical 1 and the inverted signal $\overline{DW}$ is logical 0, the logical 1 is written in the selected memory. On the other hand, when the signal $\overline{DW}$ is 0 and $\overline{DW}$ is 1, logical 0 is written in the selected cell. When both the signal DW and inverted signal $\overline{DW}$ are logical 1, the write to the selected cell is inhibited and the data stored in the selected cell is refreshed.

In case where an information stored in a memory cell is to be merely replaced by an input code word DB, the function setting circuit 15 generates the pass signal ps instead of the operation mode signal fn and supplies it to the gate circuit 18, upon which it is possible to perform a high speed write operation as in the usual DRAM.

A VRAM according to an embodiment of the present invention will now be described in detail with reference to FIG. 3 in which constitutional components which are common in the conventional circuit shown in FIG. 1 are depicted by same reference numerals. The VRAM shown in FIG. 3 includes a timing signal generator circuit (TC) 16A, which is similar to the timing signal generator 16 shown in FIG. 1 except that it further receives an $\overline{ORE}$ signal additionally to generate a logic operation timing signal $\phi L$, and an ORE input circuit (OREB) 32 for forming a buffer circuit for the signal $\overline{ORE}$, and a write read control circuit 31 which corresponds to the logic, operation circuit 17 shown in FIG. 1, and is responsive to the $\overline{ORE}$ signal to determine a logical value of an input data DI and to supply a write data DW to a memory portion 11 when the logical value is high level.

The write read control circuit 31 includes a level determination circuit 311 for determining a logical value of the signal DB corresponding to the input signal DI supplied through the data input circuit 20 when the signal LO corresponding to the signal $\overline{ORE}$ from the input circuit 32 is in the low level (active level), and a write control circuit 312 for generating a write data DW when the logical value of the output OD of the level determination circuit 311 is in the high level and for inhibiting generation of the write data DW and refreshing the selected memory cell when the logical value of the output OD of the level determination circuit 311 is in the low level. The signal DW is a complementary signal composed of a positive signal DW and an inverted signal $\overline{DW}$ as in the conventional circuit mentioned previously.

Figure 4:
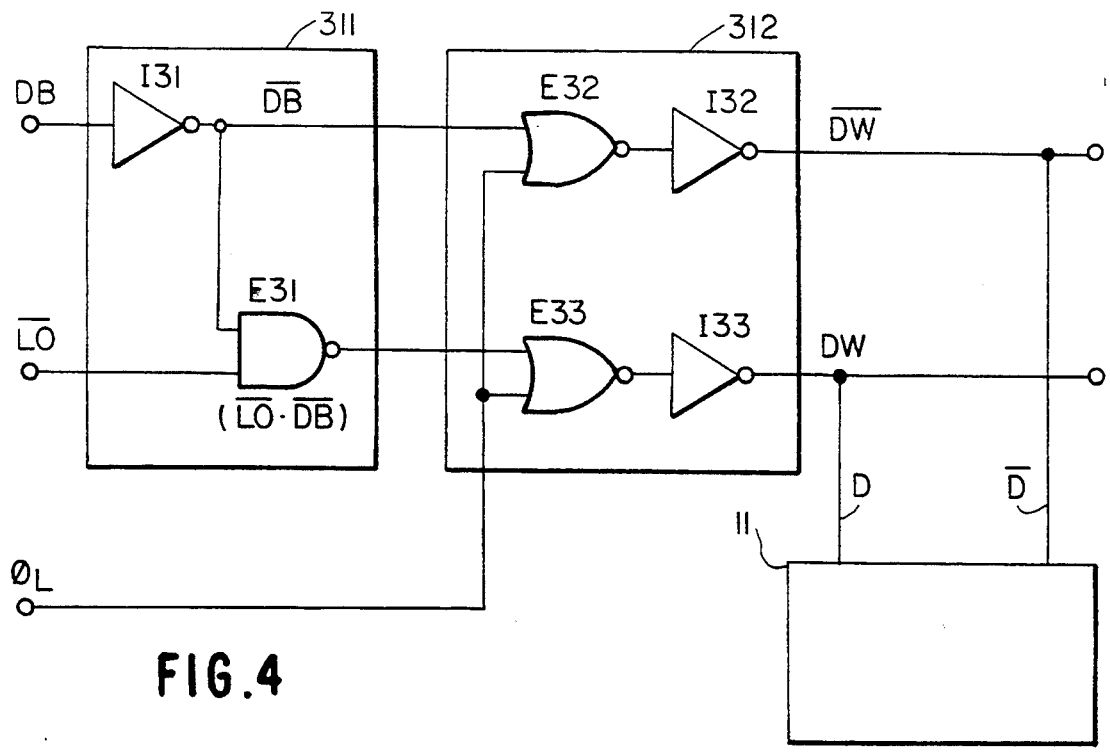
FIG. 4 is a circuit diagram of a write/read control circuit which is a portion of the embodiment shown in FIG. 3.

FIG. 4 shows an example of the level determination circuit 311 and the write control circuit 312. In FIG. 4, the logical value determination circuit 311 includes an inverter I31 for inverting the signal DB to form an inverted signal $\overline{DB}$ and an NAND gate E31 for performing NAND operation of the signal $\overline{DB}$ and the signal $\overline{LO}$. The write control circuit 312 includes a NOR gate E32 for performing NOR operation of the the inverted signal $\overline{DB}$ and the logical operation timing signal $\phi L$, an inverter I32 for inverting an output signal of the gate E32 to form an inverted signal $\overline{DW}$, a NOR gate E33 for performing NOR operation of an output of the NAND gate E31 and the logical operation timing signal $\phi L$ and an inverter I33 for inverting an output signal of the gate E33 to form an inverted signal DW.

The timing signal generator circuit 16A according to this embodiment discriminates a logical operation (OR write) mode for generating the logical operation timing signal eL in response to the supply of the $\overline{ORE}$ signal at the timing when the write enable signal $\overline{WE}$ is in low level (active level), in addition to the discrimination of the preset operation mode and the access operation mode in the timing signal generator circuit 16 shown in FIG. 1.

Figure 3:
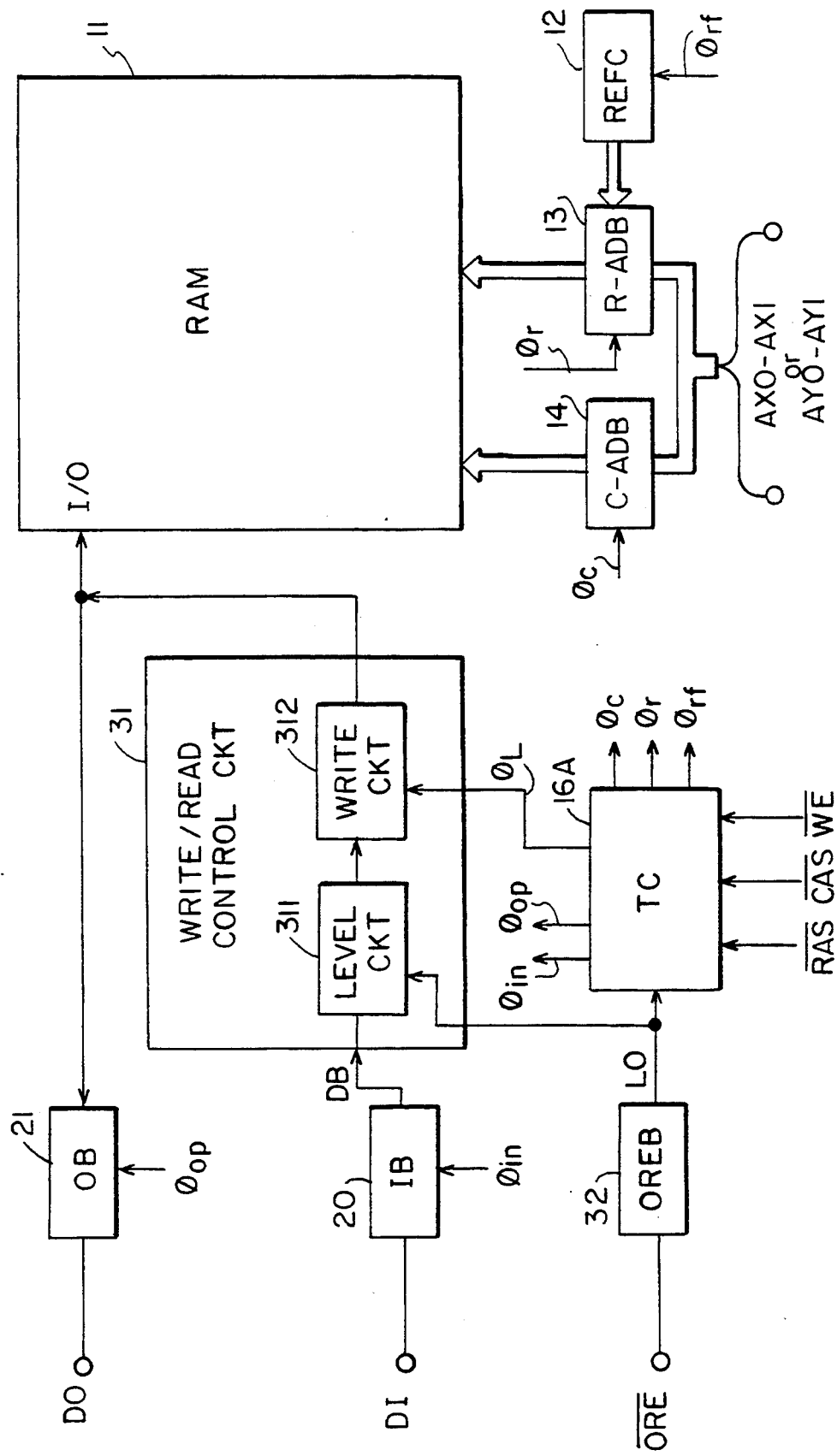
FIG. 3 is a block circuit diagram of an embodiment of the present invention.
Figure 5:
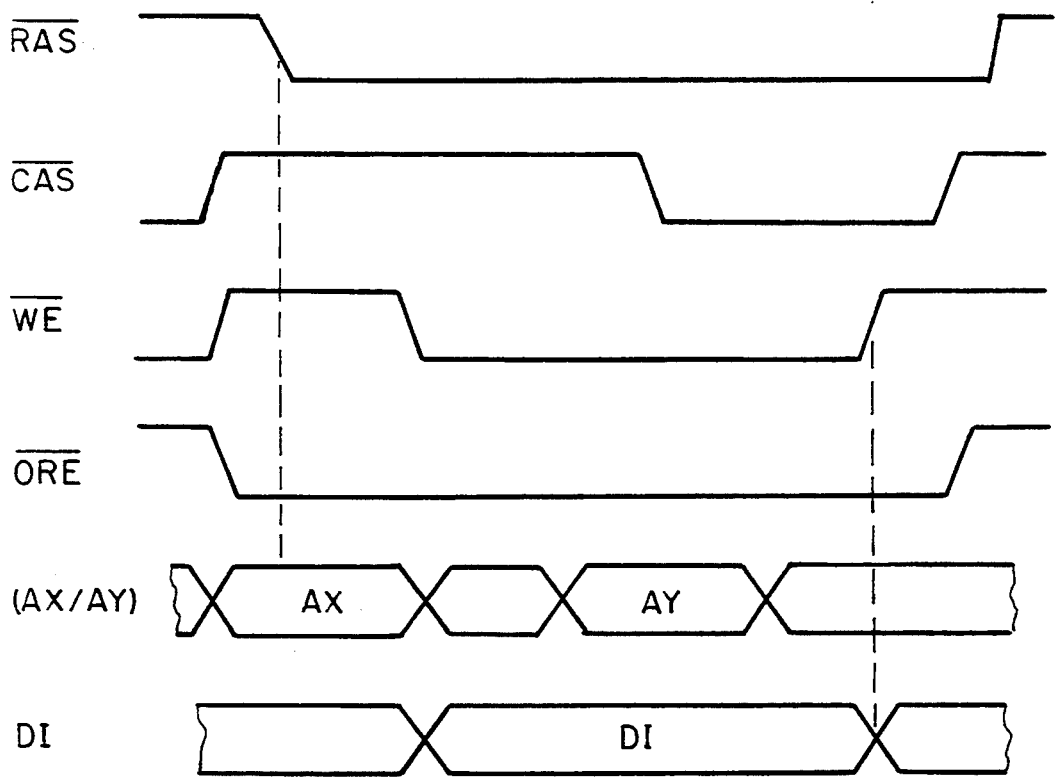
FIG. 5 is a timing chart showing an operation of the circuit shown in FIG. 3.

Referring to FIG. 5 which is the timing chart showing an operation of the VRAM shown in FIG. 3, the refresh operation thereof is first performed as in the conventional VRAM shown in FIG. 1. Then, by turning the signals $\overline{WE}$ and $\overline{ORE}$ high and low levels, respectively, in response to a state change of the signal $\overline{RAS}$ to low level, it becomes the OR operation mode. Then, in the write operation mode (write cycle) in which the signal $\overline{WE}$ is in the low level, the input code word DI from the input data terminal Di is taken in through the data input circuit 20 to form the signal DB corresponding thereto, which is supplied to one of the inputs of the level determination circuit 311. On the other hand, the signal $\overline{ORE}$ is passed through an ORE input circuit 32 to form a corresponding signal LO which is supplied to the other input of the level determination circuit 311. The level determination circuit 311 determines whether the logical value of the signal DB corresponding to the input code word DI is 1 or 0 and the write control circuit 312 instructs a write operation of logical 1 when the logical value is 1 and inhibits write and instructs rewrite of the cell data DC, that is, refresh when the logical value is 0.

Returning to FIG. 4, the signal DB is inverted by the inverter I31 and supplied to the NAND gate E31 and the NOR gate E32. The NAND gate E31 forms an inverted signal (LO·DB) which is negation of logical product of the inverted signal $\overline{LO}$, obtained from an inverter (not shown) associated with the logical value determination circuit 311, and the inverted signal $\overline{DB}$ and supplies it to one of the inputs of the NOR gate E33. The NOR gate E32 forms NOR output of the inverted signal $\overline{DB}$ and the logical operation timing signal $\phi L$. The NOR output is inverted by the inverter I32 to form the signal $\overline{DW}$ which is supplied to the memory portion 11. The NOR gate E33 forms a NOR output of the inverted signal (LO·DB) and the logical operation timing signal $\phi L$, which is inverted by the inverter I33 to form the signal DW which is supplied to the memory portion 11. If the signal DB is logical 1, the signal DW is logical 1 and the inverted signal $\overline{DW}$ is logical 0 as is clear from the above description of operation, and therefore logical 1 is written in the selected memory cell. On the other hand, if the signal DB is logical 0, the signal DW and the inverted signal $\overline{DW}$ are logical 1 and therefore write to the selected memory cell is inhibited and refresh is performed.

As described hereinbefore, the operation circuit according to the present invention is based on the fact that a logical sum of the input code word DI and the output DC read out from the selected memory cell is, whenever such an operation will be performed, always logical 1 regardless of the logical value of the DC when DI is logical 1 and, on the other hand, it coincides with the logical value of the DC when the input code word DI is logical 0. That is, the present invention is based on the fact that it is possible to effectively perform an OR operation by determining whether the logical value of the signal DI is 1 or 0 and writing logical 1 when the DI is 1 and inhibiting write and refreshing the cell data when the DI is 0.

AND operation is also realized similarly. In this case, the circuit is constructed such that, when the input code word DI is logical 0, the logical 0 is written in a selected memory cell and, when it is 1, data stored in the selected memory cell is refreshed. A circuit construction therefor will be easily considered by those skilled in the art and, therefore, details thereof are omitted.

Although the present invention has been described with reference to specific embodiments, this description is not meant to be construed in a limiting sense. Various modifications of the disclosed embodiments, as well as other embodiments of the present invention, will become apparent from the description of the present invention. It is therefore contemplated that the appended claims will cover any modifications as fall within the true scope of the present invention.

What is claimed is :

1. A semiconductor memory device comprising:
   dynamic memory means including an array of a plurality of memory cells arranged in a row and column matrix, selection means for selecting said memory cells, and write means for writing data to said memory cells;
   input means including a first input terminal for receiving an input data signal, a second input terminal for receiving an operation enable signal, and a third input terminal for receiving a write enable signal instructing said write means to write to said selected memory cell;
   level determination means disposed between said memory means and said first, second and third input terminals for determining, in synchronism with an operation timing signal supplied in response to activation of said write enable signal and said operation enable signal, whether a level value of said input data signal is a first or a second level; and
   data write control means for supplying said input data to said write means when said level value is said first level and instructing an inhibition of write to said memory write means when said level value is said second level.

2. The semiconductor memory device claimed in claim 1, wherein when said first and second levels are logical 1 and 0, respectively, said memory device thereby, substantially performs a said memory cells.

3. The semiconductor memory device claimed in claim 1, wherein when said first and second levels are logical 0 and 1, respectively, said memory device thereby substantially performs a logical AND operation on said input data and stored data in one of said memory cells.

4. The semiconductor memory device claimed in claim 1, wherein said level determination means includes a NAND gate for forming negation of a logical product of inverted values of said input data signal and said operation enable signal, and said data write control means includes a first NOR gate for forming a negation of a logical sum of an output of said NAND gate and said operation timing signal and a second NOR gate for forming a negation of a logical sum of said inverted value of said input data signal and said operation timing signal.

* * * * *

UNITED STATES PATENT AND TRADEMARK OFFICE
CERTIFICATE OF CORRECTION

PATENT NO. : 5,432,743
DATED : July 11, 1995
INVENTOR(S) : Takashi KUSAKARI

It is certified that errors appears in the above-identified patent and that said Letters Patent is hereby corrected as shown below:

Col. 4, line 67, delete "Fn" insert -- fn --

Col. 6, line 17, delete "eL", insert -- $\phi L$ --

Col. 6, line 49, delete "(LO•DB)", insert -- $(\overline{LO}\ \overline{DB})$ --

Col. 6, line 60, delete "(LO•DB)", insert -- $(\overline{LO}\ \overline{DB})$ --

Col. 7, line 7, delete "always"

Col. 8, line 23, after "a", insert -- logical OR operation on said input data and stored data in one of --

Signed and Sealed this

Sixteenth Day of January, 1996

Attest:

BRUCE LEHMAN

Attesting Officer

Commissioner of Patents and Trademarks